(12) United States Patent
Mine et al.

(10) Patent No.: US 9,318,558 B2
(45) Date of Patent: Apr. 19, 2016

(54) MOS FIELD EFFECT TRANSISTOR

(75) Inventors: Toshiyuki Mine, Tokyo (JP); Yasuhiro Shimamoto, Tokyo (JP); Hirotaka Hamamura, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 14/413,435

(22) PCT Filed: Jul. 9, 2012

(86) PCT No.: PCT/JP2012/067421
§ 371 (c)(1),
(2), (4) Date: Jan. 8, 2015

(87) PCT Pub. No.: WO2014/010006
PCT Pub. Date: Jan. 16, 2014

(65) Prior Publication Data
US 2015/0179744 A1    Jun. 25, 2015

(51) Int. Cl.
*H01L 29/16* (2006.01)
*H01L 29/66* (2006.01)
*H01L 29/78* (2006.01)
*H01L 29/792* (2006.01)
*H01L 29/06* (2006.01)
*H01L 29/12* (2006.01)
*H01L 29/10* (2006.01)
*H01L 29/423* (2006.01)
*H01L 29/51* (2006.01)

(52) U.S. Cl.
CPC ........ *H01L 29/1608* (2013.01); *H01L 29/0657* (2013.01); *H01L 29/1079* (2013.01); *H01L 29/12* (2013.01); *H01L 29/4236* (2013.01); *H01L 29/512* (2013.01); *H01L 29/517* (2013.01); *H01L 29/518* (2013.01); *H01L 29/66068* (2013.01); *H01L 29/78* (2013.01); *H01L 29/7802* (2013.01); *H01L 29/7813* (2013.01); *H01L 29/7926* (2013.01)

(58) Field of Classification Search
CPC ........... H01L 29/1608; H01L 29/1079; H01L 29/66696; H01L 29/66704; H01L 29/4236; H01L 29/666068; H01L 29/7802; H01L 29/512; H01L 29/517; H01L 29/518; H01L 29/7813; H01L 21/0445; H01L 21/8213
See application file for complete search history.

(56) References Cited

U.S. PATENT DOCUMENTS 6,956,238 B2 * 10/2005 Ryu et al. .......... 257/77
2013/0224941 A1 * 8/2013 Honaga et al. ........ 438/586

FOREIGN PATENT DOCUMENTS

JP     2008-270258 A    11/2008
JP     2011-91186 A     5/2011

* cited by examiner

*Primary Examiner* — Armando Rodriguez
(74) *Attorney, Agent, or Firm* — Miles & Stockbridge P.C.

(57) ABSTRACT

The present invention is to cause high channel mobility and a high threshold voltage to coexist in a SiC-MOSFET power device which uses a SiC substrate. The SiC MOSFET which is provided with a layered insulation film having electric charge trap characteristics on a gate insulation film has an irregular threshold voltage in a channel length direction of the SiC MOSFET, and in particular, has a shorter area having a maximum threshold voltage in the channel length direction compared to an area having other threshold voltages.

11 Claims, 14 Drawing Sheets

CHANNEL AREA (a) WHEN TWO $V_t$ EXIST IN CHANNEL
($V_{t1} < V_{t2}$, $L_{c2} < L_{c1}$)

(b) WHEN THREE $V_t$ EXIST IN CHANNEL
($V_{t1} < V_{t3} < V_{t2}$, $L_{c2} < L_{c1} < L_{c3}$)

(a) WHEN TWO $V_t$ EXIST IN CHANNEL
$(V_{t1} < V_{t2}, \quad L_{c2} < L_{c1})$ (b) WHEN THREE $V_t$ EXIST IN CHANNEL
$(V_{t1} < V_{t3} < V_{t2}, \quad L_{c2} < L_{c1} < L_{c3})$ (c) WHEN $V_t$ IS REGULAR IN CHANNEL

# MOS FIELD EFFECT TRANSISTOR

TECHNICAL FIELD

The present invention relates to a metal-oxide-semiconductor (MOS) type field effect transistor which uses silicon carbide (SiC) as a semiconductor material.

BACKGROUND ART

In order to maintain high pressure-resisting quality in using a SiC MOSFET as a power device, it is required to increase threshold voltage to some extent. In addition, at the same time, in order to realize low on-state resistance, it is required to increase channel mobility of a MOSFET (decrease channel resistance).

JP-A-2008-270258 (PTL1) discloses a method for shifting the threshold voltage of a Si trench type MOSFET to a desired value by forming a gate insulation film or a floating gate which are formed on a Si oxide film/Si nitride film/Si oxide film (ONO film) in a Si trench and by injecting a carrier into the ONO film or the floating gate. Furthermore, as a method for injecting an electric charge, a method for injecting an electron by injecting an FN electron from a Si substrate side, and a method for applying pressure between a drain and a source and injecting the electric charge by avalanche breakdown, are disclosed.

CITATION LIST

Patent Literature

[PTL 1] JP-A-2008-270258
[PTL 2] JP-A-2011-91186

SUMMARY OF INVENTION

Technical Problem

One of the tasks of a SiC MOSFET is coexistence of a high threshold voltage and high channel mobility.

FIG. 17 illustrates characteristics between a gate voltage (Vg) and a drain current (Id) of the SiC MOSFET which has an ONO film as a gate insulation film. FIG. 18 illustrates characteristics between the gate voltage (Vg) and mutual conductance (Gm). For example, when an electric charge (electron injection in the drawing) is injected into the ONO film, as illustrated in FIG. 17, the Vg-Id characteristics shift from initial characteristics in parallel, to the right side of the drawing. Similarly, as illustrated in FIG. 18, while a maximum value of the mutual conductance (Gm) remains constant, the characteristics shift in parallel to the right side. In other words, by injecting the electron into the ONO film or a floating gate that exists on an upper portion of a channel area, a threshold voltage increases, and thus, it is possible to improve reliability with respect to surge noise or the like.

Meanwhile, when the threshold voltage simply increases in a state where the gate voltage (Vg) which is an ON-voltage output of a gate driver is constant, since an overdrive voltage (voltage which exceeds the threshold voltage and is applied) which is applied to a gate electrode decreases, the drain current (Id) in the gate voltage (Vg) necessarily decreases. In the case of FIG. 17, the drain current (Id) of 20V of the gate voltage Vg significantly decreases according to an increase of the threshold voltage (Vt). In other words, relatively, the result is the same as that in a case where the channel mobility decreases, and the problem of the coexistence of the high threshold voltage and the high channel mobility is not solved.

An object of the present invention is to make the high channel mobility and the high threshold voltage coexist in the SiC-MOSFET.

Solution to Problem

One of the solutions to solve the above-described problem is a SiC MOSFET provided with a layered insulation film having electric charge trap characteristics on a gate insulation film which causes a threshold voltage in a channel length direction of the SiC MOSFET to be irregular, and in particular, a SiC MOSFET which has a shorter area having a maximum threshold voltage in the channel length direction compared to an area having other threshold voltages.

Advantageous Effects of Invention

According to the present invention, it is possible to obtain a SiC MOSFET which has both a high threshold voltage and high channel mobility.

DESCRIPTION OF EMBODIMENTS

Figure 1:
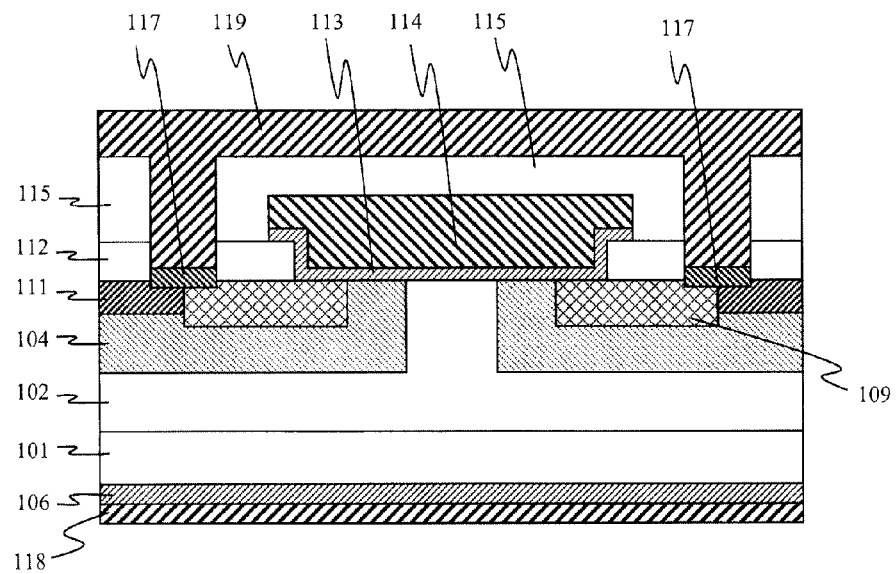
FIG. 1 illustrates a part of a cross-sectional structure of a SiC DiMOSFET of Embodiment 1.

In the invention included in the present application, one of the solutions to achieve the above-described task is a SiC MOSFET provided with a layered insulation film having electric charge trap characteristics on a gate insulation film which causes a threshold voltage in a channel length direction of the SiC MOSFET to be irregular, and in particular, a SiC MOSFET which has a shorter area having a maximum threshold voltage in the channel length direction compared to an area having other threshold voltages.

Specifically, by manufacturing the SiC MOSFET provided with the layered insulation film having the electric charge trap characteristics on the gate insulation film and injecting an electric charge (electron) into the above-described gate insulation film, the threshold voltage increases. At this time, by increasing only an electron trap amount in a local area of the gate insulation film, it is possible to obtain a SiC MOSFET having both a high threshold voltage and high channel mobility.

In this manner, a method which is preferable for increasing the electron trap amount in the local area is a method for increasing an electron injection amount in the local area of the gate insulation film by generating electric field concentration only in the local area. Specifically, examples of the method includes: (1) a method for forming a (subtle) unevenness in the local area of a SiC substrate front surface on which a channel is formed and injecting the electron into the gate insulation film by injecting an FN electron; and (2) a method for adjusting a gate voltage and a drain voltage (source voltage) and injecting the electron into the gate insulation film by generating a hot carrier.

In the above-described method (1), the electron is injected into the entire channel area. However, in a case where there is a convex portion in the local area, the electric field concentration is generated in the convex portion, the electron injection amount increases compared to the electron injection amount in other areas, and the electron trap amount increases. In other words, a Vt increases only in the local area where the convex portion exists.

In the above-described method (2), the electron is injected locally by the hot carrier, but it is important that the electron is injected into a source end portion in a case where the SiC MOSFET performs a switching operation. For this, it is required that a drain side (rear surface of a SiC substrate) when normally operating be grounded, the hot carrier be generated by adjusting a source (front surface side of the SiC substrate) and the gate voltage, and the electron be injected into the gate insulation film of the source end portion. Therefore, in order to inject the hot carrier into the source end portion, a device structure which separately controls a p-type body which is the channel area and a source area, is required.

As a precaution, during the local electron injection into the gate insulation film, the electron injection is performed into a place which is farthest separated from a drain end portion. In a normal switching operation, a depletion layer of the drain end portion extends to a source side. At this time, the Vt in which an electric field of the electron injected into the gate insulation film of the drain end portion is sealed deteriorates. In other words, the Vt changes by a potential on the drain side. For this reason, in a case where the local injection of the electron into the gate insulation film is performed, it is important that an area in which the Vt becomes the largest is disposed on the source side to the utmost.

The layered insulation film having the electric charge trap characteristics is used as the gate insulation film of the SiC MOSFET. However, an example of the gate insulation film having the electric charge trap characteristics also includes a three-layered film having a potential barrier film with respect to the electric charge trapped above and below the electric charge trap film. For example, a Si oxide film/Si nitride film/Si oxide film, a Si oxide film/Si nitride film/Si oxynitride film, a Si oxide film/alumina film/Si oxide film, a Si oxide film/alumina film/Si oxynitride film, or the like, is a representative insulation film. In the above-described layered film, the Si nitride film or the alumina film in the central part is an electric charge retention film, and the Si oxide film or the Si oxynitride film in upper and lower parts is the potential barrier film. In the patent specification, the potential barrier film which is positioned on the upper and the lower sides of the electric charge trap film will be respectively described as a top barrier film and a bottom barrier film.

When the electron is injected into the layered film, the electron is trapped in an interface between the bottom barrier film and the electric charge trap film, and on the interface between the electric charge trap film and the top barrier film. A trapping level of the electron of the Si nitride film or the alumina film exists at a depth which is equal to or greater than 1 eV from a conduction band, and illustrates extremely stable trapping characteristics. In addition, unlike a floating gate structure in which a poly-Si film that is represented by a flash memory is used, even when a defect is generated in a part of a barrier film since the trapping is discrete electric charge trapping, by decreasing the electric charge only in the local area, it is advantageous that the change of the threshold voltage of a MOSFET barely occurs.

It is preferable that the film thickness of the Si nitride film or the alumina film which is the electric charge trap film be equal to or greater than 5 nm since the sufficient trapping characteristics are not shown if the thickness is equal to or less than 5 nm. The film thickness of the barrier film which is positioned above and below the electric charge trap film is extremely important since the electric charge trap characteristics (retention characteristics) depend on the film thickness of the barrier film. According to the investigation of the inventors, for example, under a circumstance (for 10 years) in which the gate electric field is at approximately 3 MV/cm at 175° C., in order to ensure a threshold voltage variation amount to be equal to or less than 0.5 V, it is required that the film thickness of the upper and lower barrier films be equal to or greater than approximately 10 nm. Therefore, in the present invention, since it is required that the electric charge trap film be equal to or greater than 5 nm, and the upper and lower barrier films respectively be equal to or greater than 10 nm, a physical lower limit of the film thickness of the gate insulation film is approximately 25 nm.

There is no problem even when the film thickness of the upper barrier film and the film thickness of the lower barrier film are the same as each other. However, when a set film thickness of the gate insulation film is equal to or greater than 25 nm, it is preferable that the film thickness of the top barrier film increase. This is because a threshold voltage shift becomes large as the film thickness of the top barrier film increases, in a case where the same number of electrons are trapped and compared on the gate insulation film which has an electrically equivalent film thickness. In other words, as the film thickness of the top barrier film increases in order to obtain a target threshold voltage, the electric field applied to the barrier film decreases since the number of trapped electrons can be decreased. As a result, it is advantageous that the retention characteristics are improved.

In addition, in a case where the barrier films which are the same type of film and have the same film thickness are compared, it is preferable that the electric charge trap film use the alumina film rather than the Si nitride film. The Si nitride film includes a positive fixed electric charge, and the alumina film includes a negative fixed electric charge. If the initial threshold voltages before trapping the electron are compared, the alumina film including the negative fixed electric charge shows a greater value. For this reason, since it is possible to reduce the number of electrons which are trapped by using the alumina film, the retention characteristics are further improved.

It is preferable that a Si oxide film which is formed by thermally oxidizing the SiC substrate, a Si oxynitride film which is formed by an oxynitriding process in the NO atmosphere at a high temperature, a Si oxynitride film which is formed by oxynitriding the Si oxide film formed by a chemical vapor deposition (CVD method) in the NO atmosphere at a high temperature, or a Si oxynitride film which is formed by directly oxynitriding the SiC substrate in the NO atmosphere at a high temperature, be used as the bottom barrier film which is in contact with the SiC substrate. This is because an interface level of the SiC substrate interface decreases according to a NO oxynitriding process.

Embodiment 1

Embodiment 1 is a double-implanted MOSFET (DiMOSFET) which is formed on a (0001) Si surface of a 4H-SiC substrate.

FIG. 1 is a cross-sectional structure of the DiMOSFET which is manufactured by the present embodiment. Reference number 101 represents a high-concentration n-type SiC substrate, reference number 102 represents a low-concentration n-type drift layer, reference number 104 represents a p-type body layer, reference number 106 represents a high-concentration n-type layer on a SiC rear surface side, reference number 109 represents a high-concentration n-type diffusion layer, reference number 111 represents a high-concentration p-type diffusion layer, reference numbers 112 and 115 represent insulation films, reference number 113 represents a gate insulation film having electric charge retention characteristics, reference number 114 represents a gate electrode, reference number 117 represents a silicide layer, reference number 118 represents a rear surface silicide layer (drain electrode), and reference number 119 represents alumina wiring (source electrode).

Figure 2:
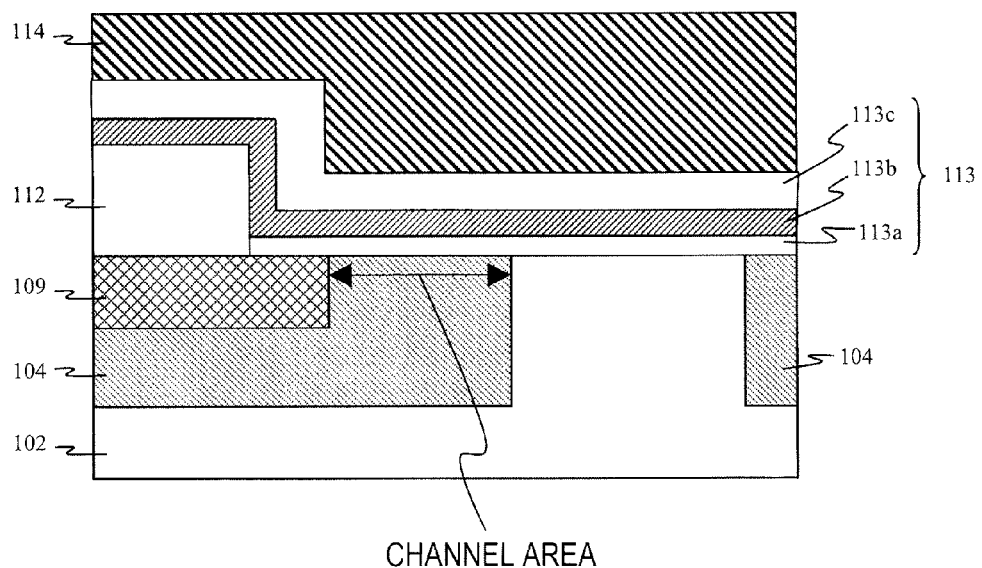
FIG. 2 illustrates a part of a cross-sectional structure of the SiC DiMOSFET of Embodiment 1.

FIG. 2 is an enlarged view of a channel area of the DiMOSFET illustrated in FIG. 1.

A channel of the DiMOSFET is formed in an area which is sandwiched between the gate electrode 114 and the p-type body layer 104. In the present embodiment, after this, the electron is irregularly injected into the local area of the gate insulation film 113 which is positioned right above the channel area and has the electric charge retention characteristics, and the threshold voltage in this area becomes irregular.

By grounding the source electrode 119 to a ground, applying a positive voltage to the drain electrode 118, and applying the positive voltage (equal to or greater than the threshold voltage) to the gate electrode 114, a current is made to flow between the source 119 and the drain 118 (in a longitudinal direction of the SiC substrate). When the gate voltage is set to be equal to or less than the threshold voltage, the current is blocked.

Hereinafter, a manufacturing method of the DiMOSFET according to the present embodiment will be described with reference to the drawings. In addition, in the present embodiment, a SiC DiMOS having 3 types of specifications is manufactured. A sample No. 1 is a SiC DiMOS which is formed by a method in the related art, and samples No. 2 and No. 3 are SiC DiMOS according to the present invention. The sample No. 2 forms a subtle unevenness on the SiC substrate front surface by a p body forming process. In addition, the sample No. 3 forms a subtle unevenness on the SiC substrate front surface by a high-concentration n-type diffusion layer (source) forming process. In the method in the related art, the subtle unevenness is not formed on the SiC substrate front surface.

Figure 3:
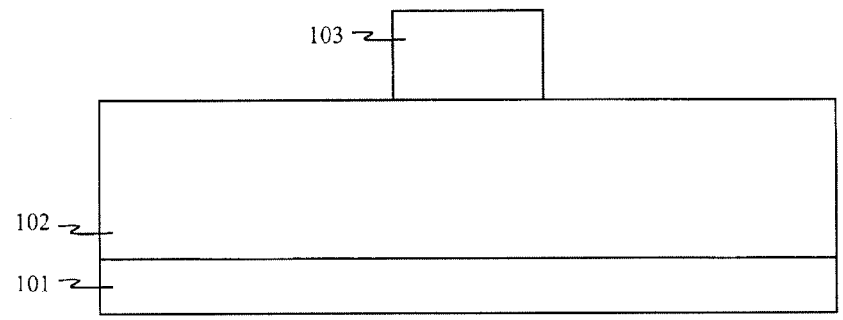
FIG. 3 illustrates a part of a cross-sectional structure of the SiC DiMOSFET of Embodiment 1.

First, the high-concentration n-type SiC substrate 101 in which the low-concentration n-type drift layer 102 is formed at approximately 10 um (epitaxial growth) is prepared, and a $SiO_2$ pattern 103 which is a mask for ion-injection of a p-type body is formed (FIG. 3). Here, in the sample No. 1 (method in the related art) and the sample No. 3 (method in the present invention), only the $SiO_2$ pattern is formed, but in the sample No. 2, etching of the low-concentration n-type drift layer 102 is performed intentionally. Here, the etching depth of the low-concentration n-type drift layer 102 is approximately 10 nm.

Figure 4:
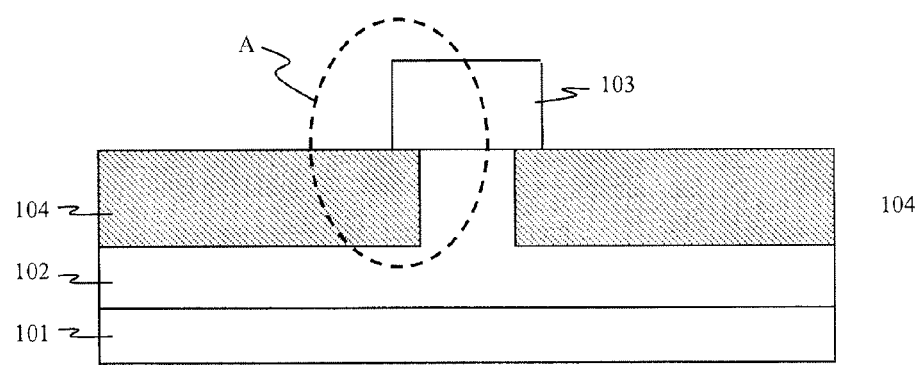
FIG. 4 illustrates a part of a cross-sectional structure of the SiC DiMOSFET of Embodiment 1.
Figure 5:
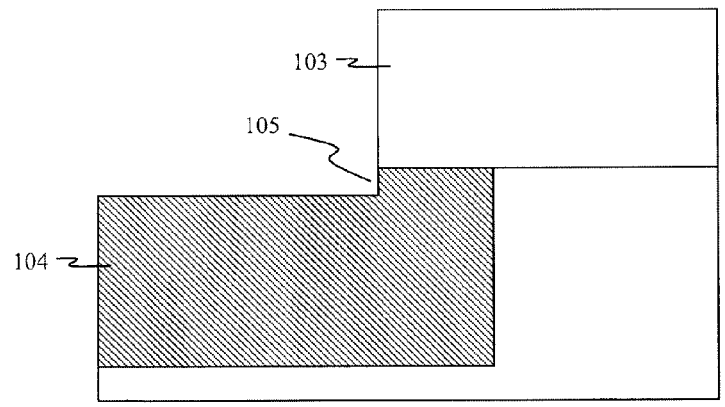
FIG. 5 illustrates a part of a cross-sectional structure of the SiC DiMOSFET of Embodiment 1.

Next, aluminum is ion-injected into an area which is the p-type body 104 which has the above-described $SiO_2$ pattern 103 as a mask (FIG. 4). In general, in an ion-injection method, the ion is injected into an area which is on the inside of the $SiO_2$ pattern 103 from both end portions of the $SiO_2$ pattern 103 since there is an oblique component of the injected ion. This condition is different from an injection condition, but in the present embodiment, the ion is injected at approximately 100 nm of an entering length from the edge of the $SiO_2$ pattern 103. FIG. 5 illustrates a cross section of the sample No. 2 in which the etching of the low-concentration n-type drift layer 102 is performed. FIG. 5 is an enlarged view of an area surrounded by a dotted line A in FIG. 4. In addition, the samples No. 1 and No. 3 are as illustrated in FIG. 4. In this manner, in the sample No. 2, approximately 10 nm of a subtle step 105 is formed on the front surface of the low-concentration n-type drift layer 102. After this, high-concentration nitrogen is ion-injected into the rear surface side of the SiC substrate 101 which is the drain, and the high-concentration n-type layer 106 is formed.

Figure 6:
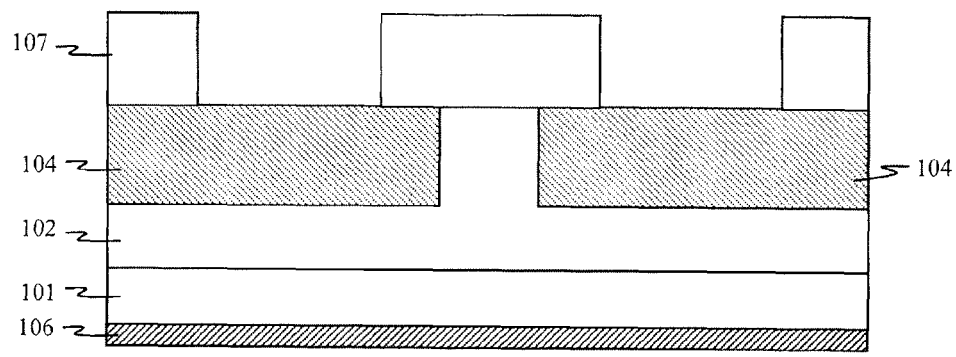
FIG. 6 illustrates a part of a cross-sectional structure of the SiC DiMOSFET of Embodiment 1.

Next, after removing the above-described $SiO_2$ pattern 103, a $SiO_2$ pattern 107 which is a mask of ion-injection of the high-concentration n-type diffusion layer is formed on the SiC substrate front surface (FIG. 6). Here, in the sample No. 1 (method in the related art) and the sample No. 2 (method in the present invention), only the $SiO_2$ pattern is formed, but in the sample No. 3, the etching of the low-concentration n-type drift layer 102 is performed intentionally. Even here, the etching depth of the low-concentration n-type drift layer 102 is approximately 10 nm.

Figure 7:
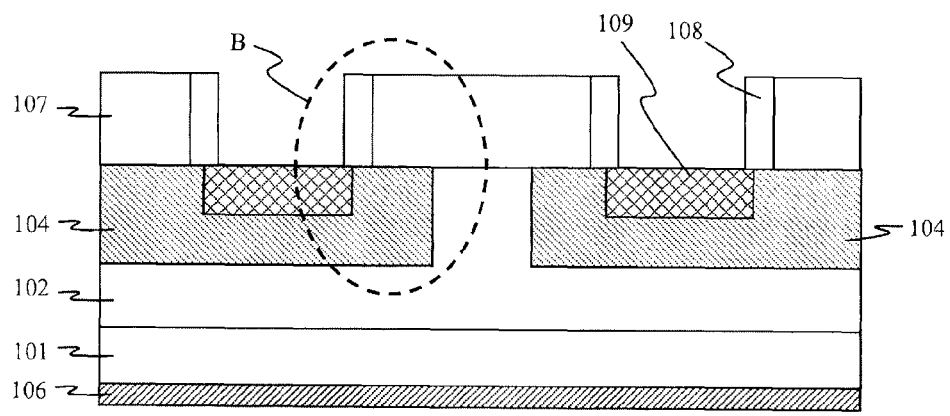
FIG. 7 illustrates a part of a cross-sectional structure of the SiC DiMOSFET of Embodiment 1.
Figure 8:
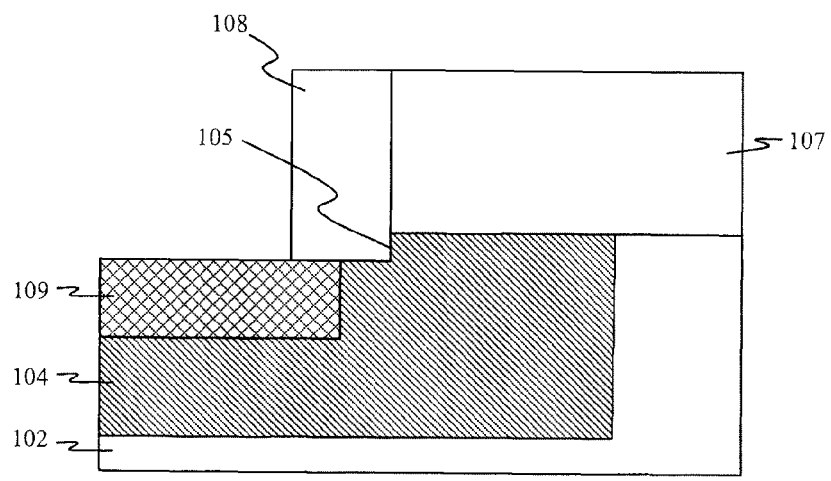
FIG. 8 illustrates a part of a cross-sectional structure of the SiC DiMOSFET of Embodiment 1.
Figure 9:
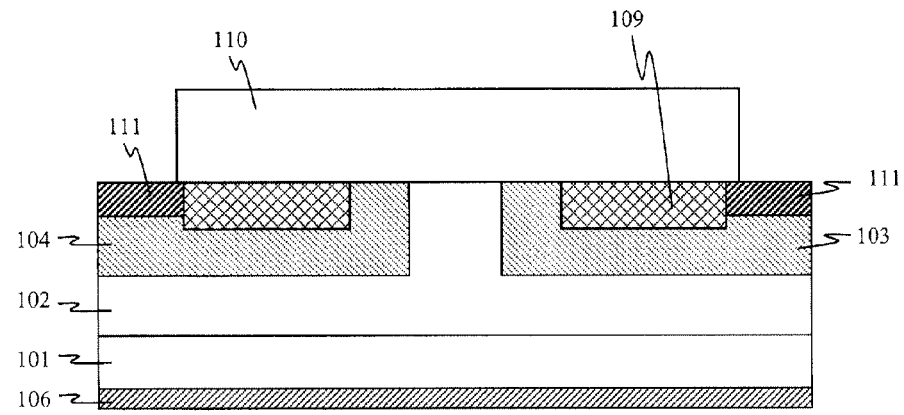
FIG. 9 illustrates a part of a cross-sectional structure of the SiC DiMOSFET of Embodiment 1.

Next, by using a low-pressure chemical vapor deposition method (LP-CVD method), after forming a $SiO_2$ film 108 having 200 nm of thickness on the entire front surface, an $SiO_2$ side spacer 108 is formed on a side wall of the above-described $SiO_2$ pattern 107 by anisotropically dry-etching a $SiO_2$ film having 200 nm of thickness. After this, nitrogen is ion-injected into an area which is the high-concentration n-type diffusion layer 109 by using the $SiO_2$ pattern 107 and the side spacer 108 as masks. FIG. 8 illustrates a cross section of the sample No. 3, in which the etching of the low-concentration n-type drift layer 102 is performed. FIG. 8 is an enlarged view of an area surrounded by a dotted line B in FIG. 7. In addition, the samples No. 1 and No. 2 are as illustrated in FIG. 7. In this manner, in the sample No. 3, approximately 10 nm of the subtle step 105 is formed on the front surface of the low-concentration n-type drift layer 102. Even during the nitrogen ion-injection, due to the oblique component of the ion, the entering length is approximately 100 nm from the edge of a $SiO_2$ pattern 108. As illustrated in FIG. 8, the subtle step 105 formed on the front surface of the low-concentration n-type drift layer 102 of the sample No. 3, is formed outside the high-concentration n-type diffusion layer 109. The distance from the edge of the high-concentration n-type diffusion layer 109 to the subtle step 105 can be adjusted by the formed film thickness of the $SiO_2$ side spacer. Under this nitrogen ion-injection condition, in a case where the film thickness of the $SiO_2$ side spacer is equal to or less than 100 nm, the subtle step 105 is formed inside the high-concentration n-type diffusion layer 109. Since there is absolutely no influence on the threshold voltage even when the electron is injected into the upper portion of the high-concentration n-type diffusion layer 109 which is the source area, it is required that the subtle step be formed outside the high-concentration n-type diffusion layer 109. In the present embodiment, the subtle step 105 is formed at a place which is separated from the edge of the high-concentration n-type diffusion layer 109 by approximately 100 nm.

Next, after removing the $SiO_2$ patterns 107 and 108, a $SiO_2$ pattern 110 which is an ion-injection mask for the high-concentration p-type diffusion layer 111 is formed. Next, aluminum is ion-injected, and the high-concentration p-type diffusion layer 111 is formed. After this, after removing all of the $SiO_2$ patterns, a carbon film (not illustrated) having 50 nm of thickness is formed by a plasma CVD method on the front surface and the rear surface of the SiC substrate, and annealing is performed for 2 minutes at 1800° C. Then, after removing the above-described carbon film by plasma etching, predetermined cleansing and cleaning of the SiC substrate is performed.

Figure 10:
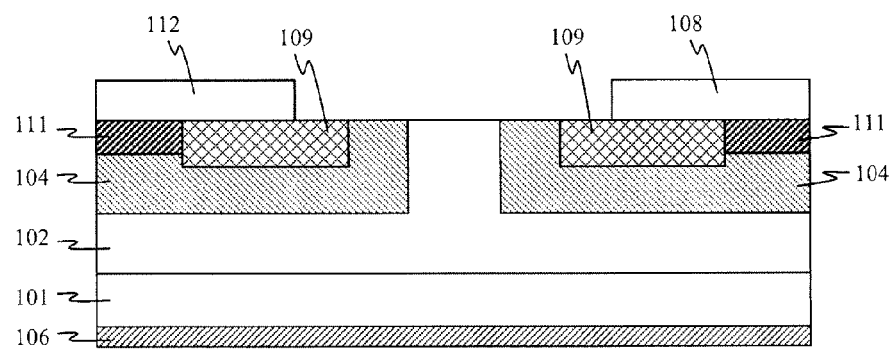
FIG. 10 illustrates a part of a cross-sectional structure of the SiC DiMOSFET of Embodiment 1.

Next, after forming the Si oxide film 112 with approximately 500 nm of thickness by the CVD method on the front surface side of the SiC substrate, an area in which the gate insulation film 113 is formed to be open, and the front surface of the SiC substrate is locally exposed (FIG. 10).

Figure 11:
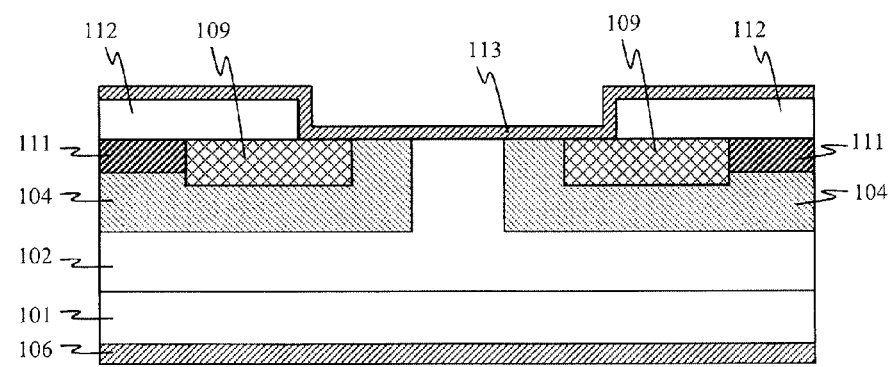
FIG. 11 illustrates a part of a cross-sectional structure of the SiC DiMOSFET of Embodiment 1.
Figure 12:
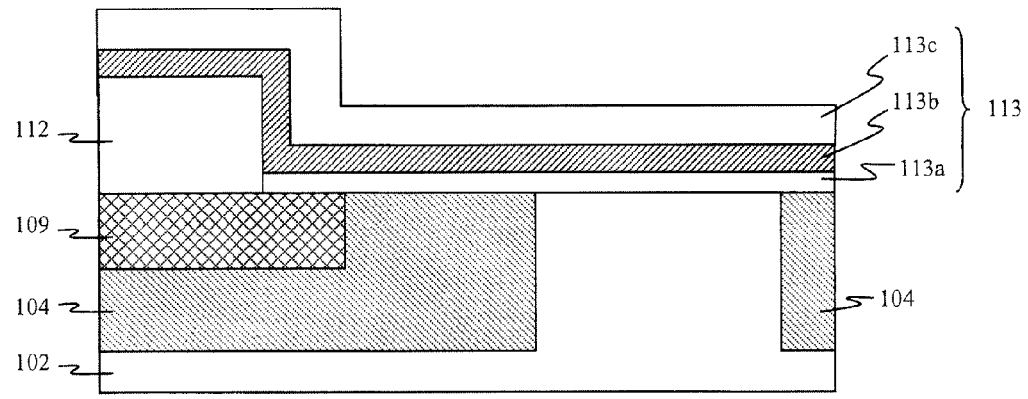
FIG. 12 illustrates a part of a cross-sectional structure of the SiC DiMOSFET of Embodiment 1.

Next, the layered gate insulation film 113 having the electric charge trap characteristics is formed (FIG. 11). The gate insulation film 113 which is formed in the present embodiment is formed of the three-layered film as illustrated in FIG. 12. First, the SiC substrate is heat-treated in a NO gas atmosphere at 1300° C. initially, and a Si oxynitride film 113a having 10 nm of thickness is formed. Next, through an atomic layer deposition CVD method (hereinafter, referred to as an ALD-CVD method) in which trimethylaluminum (TMA) and ozone (O3) are used as source gas, an alumina film 113b having 10 nm of thickness is formed. Then, through the CVD method in which dichlorosilane (SiH2Cl2) and nitrous oxide (N2O) are used as source gas, after forming a Si oxide film 113c having 35 nm of thickness, wet oxidation is performed for 10 minutes at 850° C., and thus, quality of the above-described Si oxide film 113c is improved. Here, the Si oxynitride film 113a on the lowest layer is a bottom barrier film 113a, the Si oxide film 113c on the most upper layer is a top barrier film 113c, and the alumina film 113b on an intermediate layer is an electric charge retention film 113b.

In the present embodiment, the above-described bottom barrier film 113a is described as the Si oxynitride film 113a. However, strictly speaking, nitrogen concentration in a bulk area is slightly different, and most of the nitrogen exists on the SiC interface. The nitrogen which exists on the SiC interface reduces interface state density on the 4H-SiC substrate interface. According to the investigation of the inventors, in a case where the heat treatment is performed at 1300° C. in the high-concentration NO atmosphere (approximately 90%), the nitrogen concentration on the SiC substrate interface is approximately 1%. As a result of comparing the interface state density when the NO annealing is performed and the interface state density when the NO annealing is not performed, the interface state in the vicinity of the conduction band of the silicon carbide is reduced by approximately 1 level by performing the NO annealing.

Figure 13:
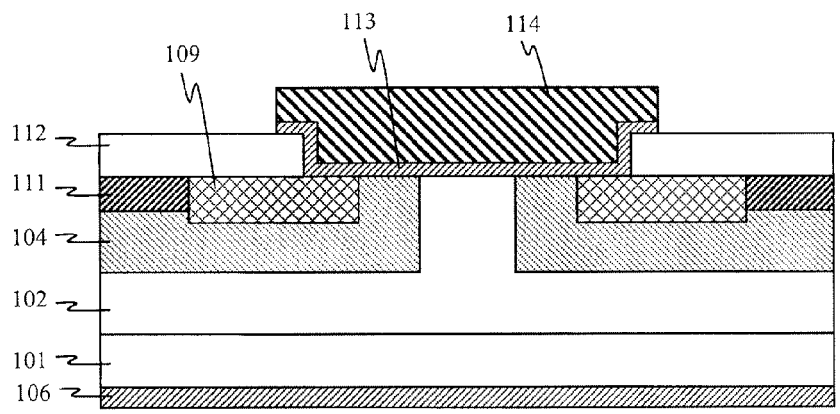
FIG. 13 illustrates a part of a cross-sectional structure of the SiC DiMOSFET of Embodiment 1.

Next, after forming a phosphorus-doped amorphous Si film having 500 nm of thickness by the CVD method in which disilane (Si2H6) and phosphine (PH3) are used as the source gas, a phosphorus-doped polycrystalline Si film 114 is formed through the heat treatment at a high temperature. After this, a gate electrode 114 is formed by using lithography and a dry-etching technology and by processing the above-described phosphorus-doped polycrystalline Si film. In the present embodiment, a part of the gate insulation film 113 below the gate electrode 114 is also removed by dry-etching. As illustrated in FIG. 13, the edge of the gate electrode 113 of the DiMOSFET which is formed in the present embodiment is processed on the thick Si oxide film 112, and is considered so that reliability of the gate insulation film 113 does not deteriorate.

Figure 14:
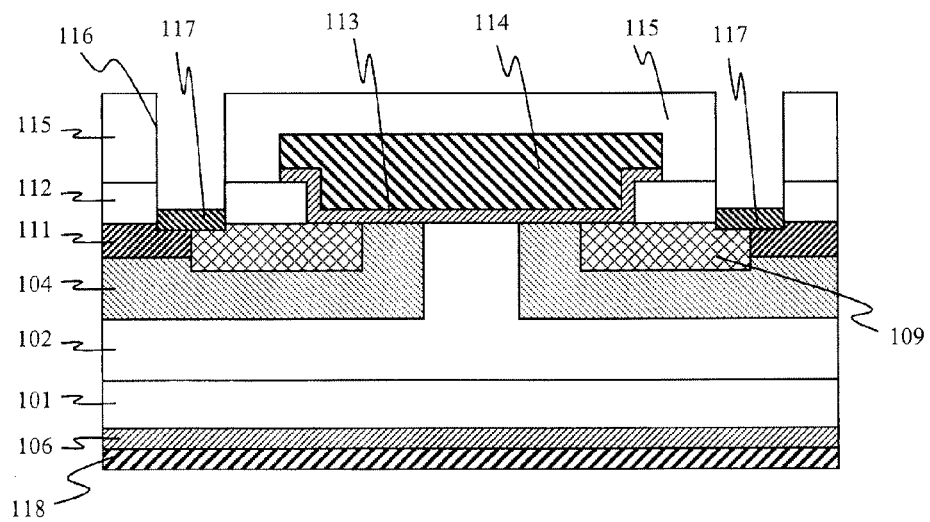
FIG. 14 illustrates a part of a cross-sectional structure of the SiC DiMOSFET of Embodiment 1.

Next, after forming the insulation film 115 through the CVD method, the high-concentration p-type diffusion layer 111 and the high-concentration n-type diffusion layer 109 of the SiC substrate form an exposed opening portion 116 simultaneously. After this, nickel silicide 117 and nickel silicide 118 are formed on the front surface of the diffusion layer on the bottom portion of the above-described opening portion 116 and on the rear surface of the SiC substrate (FIG. 14). Although not illustrated in FIG. 14, after this, an opening portion in which a front surface of the gate electrode 114 is exposed is formed.

Figure 15:
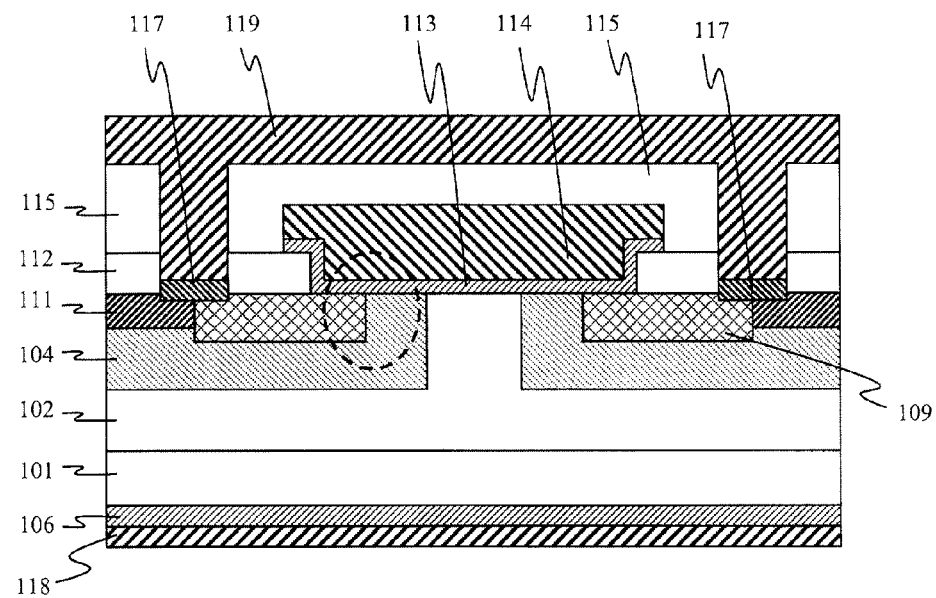
FIG. 15 illustrates a part of a cross-sectional structure of the SiC DiMOSFET of Embodiment 1.

At last, after performing dry-cleansing of the front surface of the nickel silicide and depositing a Ti/TiN/AL layered film thereon, the above-described layered wiring is processed into a predetermined shape, and the source wiring 119 and a gate electrode pad are formed (FIG. 15).

By applying the voltage to the three completed samples from the outside, the electron is injected into the layered gate insulation film 113. The electron injection into the layered gate insulation film 113 is performed by fixing the source electrode 119 and the drain electrode 118 at 0 V, and by applying a 38 V direct current voltage (DC) pulse to the gate electrode 114. By setting a pulse interval to be 100 nanoseconds, the characteristics between the gate voltage and the drain current (Vg-Id characteristics) or the characteristics between the gate voltage and the mutual inductance (Vg-Gm characteristics) for each threshold voltage, can be compared to each other.

Figure 17:
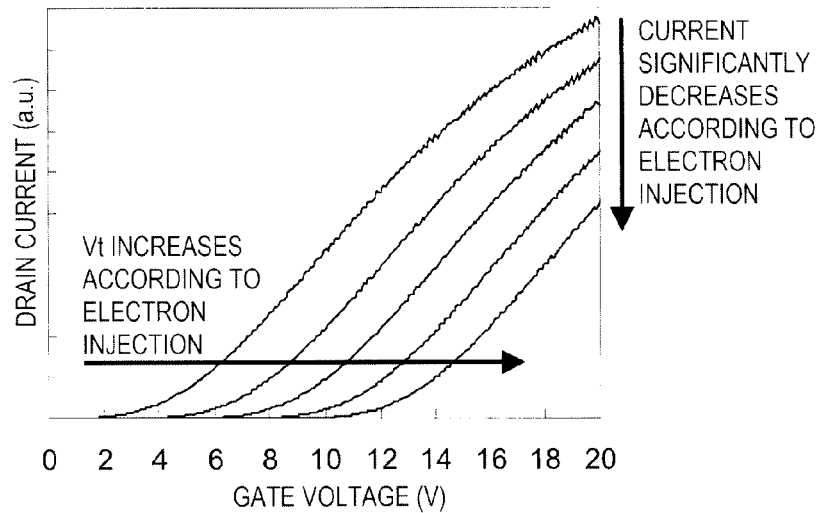
FIG. 17 illustrates characteristics between a gate voltage and a drain current when an electron is injected into a SiC MOSFET in the related art.
Figure 18:
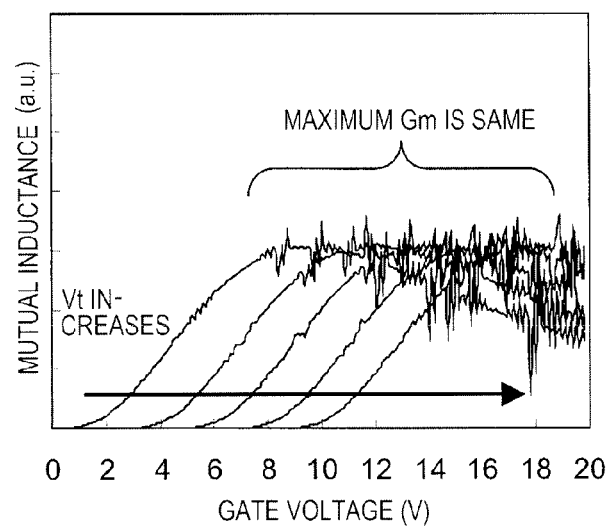
FIG. 18 illustrates characteristics between the gate voltage and mutual inductance when the electron is injected into the SiC MOSFET in the related art.
Figure 19:
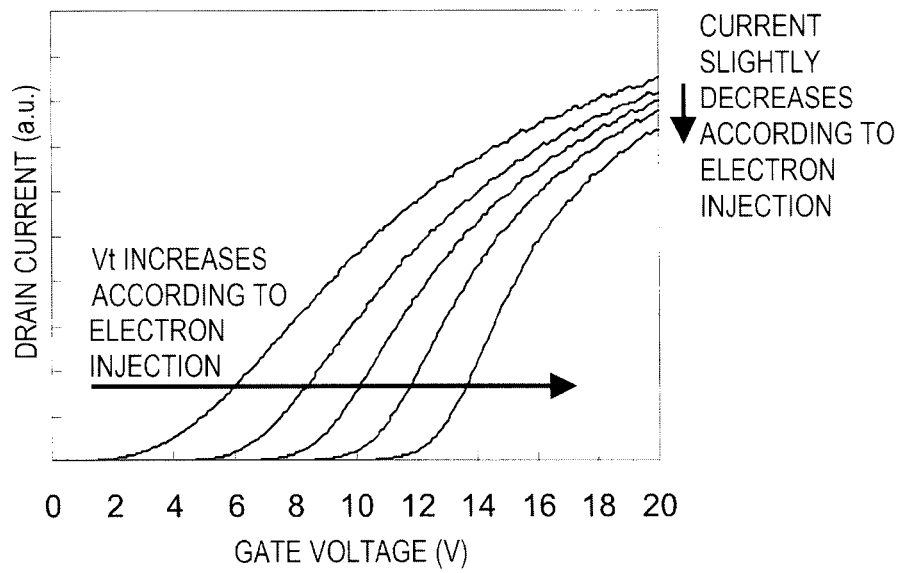
FIG. 19 illustrates characteristics between a gate voltage and a drain current when an electron is injected into a SiC MOSFET of Embodiment 1.
Figure 20:
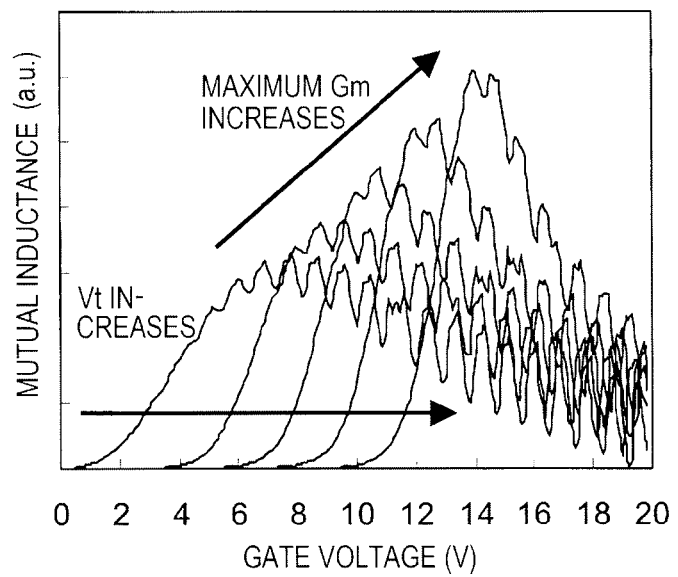
FIG. 20 illustrates characteristics between the gate voltage and mutual inductance when the electron is injected into the SiC MOSFET of Embodiment 1.

FIGS. 17 and 18 illustrate the characteristics of the sample No. 1 which uses the method in the related art. FIGS. 19 and 20 illustrate the characteristics of the sample No. 3 of the present embodiment. In addition, since the result of the electric characteristics of the sample No. 2 in the present embodiment illustrates almost the same characteristics as the result of the sample No. 3, data of the sample No. 3 is described in the present embodiment. As illustrated in FIGS. 17 and 18, in the case of the SiC MOSFET which is formed by the method in the related art, by performing the electron injection into the gate insulation film 113, the Vg-Id characteristics or the Vg-Gm characteristics shift in parallel in a positive direction. Meanwhile, as illustrated in FIGS. 19 and 20, in the case of the SiC MOSFET of the present embodiment, by performing the electron injection, it is found that the threshold voltage increases, but the Vg-Id characteristics or the Vg-Gm characteristics do not shift in parallel. Specifically, by performing the electron injection, in the Vg-Id characteristics, an area where the drain current is small significantly shifts in the positive direction. However, a change of an area where the drain current is large is small. In addition, it is found that, by performing the electron injection, in the Vg-Gm characteristics, the maximum Gm value increases.

Figure 21:
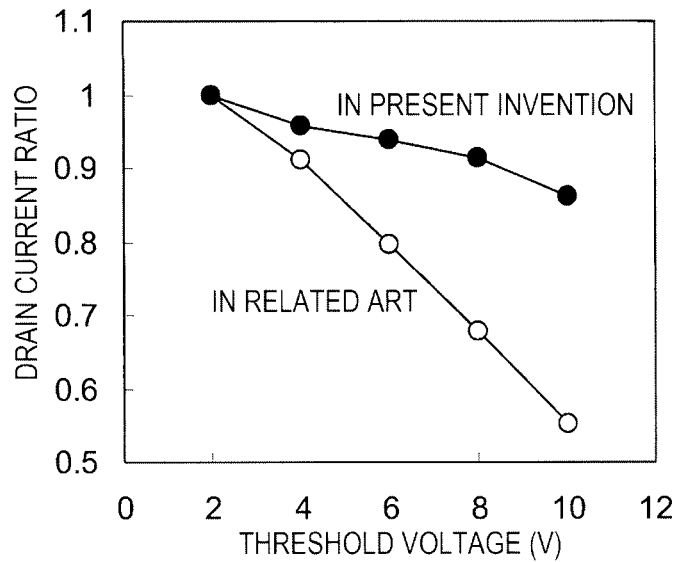
FIG. 21 illustrates a view comparing relationships between a threshold voltage and a drain current ratio in a case where the electron is injected into the SiC MOSFET.
Figure 22:
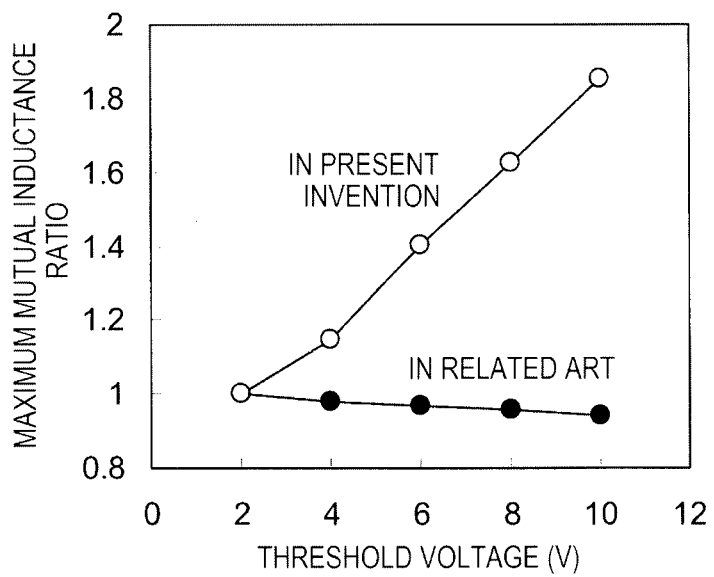
FIG. 22 illustrates a view comparing relationships between the threshold voltage and a maximum mutual conductance ratio in a case where the electron is injected into the SiC MOSFET.

FIGS. 21 and 22 illustrate a comparison between FIGS. 17 to 20. FIG. 21 is a view in which the drain current of the gate voltage Vg=20 V is standardized with the drain current before the electron injection. Meanwhile, FIG. 22 is a view in which the maximum value of the mutual inductance (Gm) is standardized with the maximum Gm value before the electron injection. When comparing the drain current in FIG. 21, it is found that a decrease of the drain current in the present invention is substantially suppressed (for example, the drain current is approximately 92% when the threshold voltage is 8 V), while the drain current drastically decreases according to the electron injection in the method in the related art (for example, the drain current is approximately 68% when the threshold voltage is 8 V).

Similarly, when comparing the maximum mutual inductance (Gm_max) in FIG. 22, the Gm_max drastically increases in the present invention, while the Gm-max slightly decreases according to the electron injection in the method in the related art.

Figure 16:
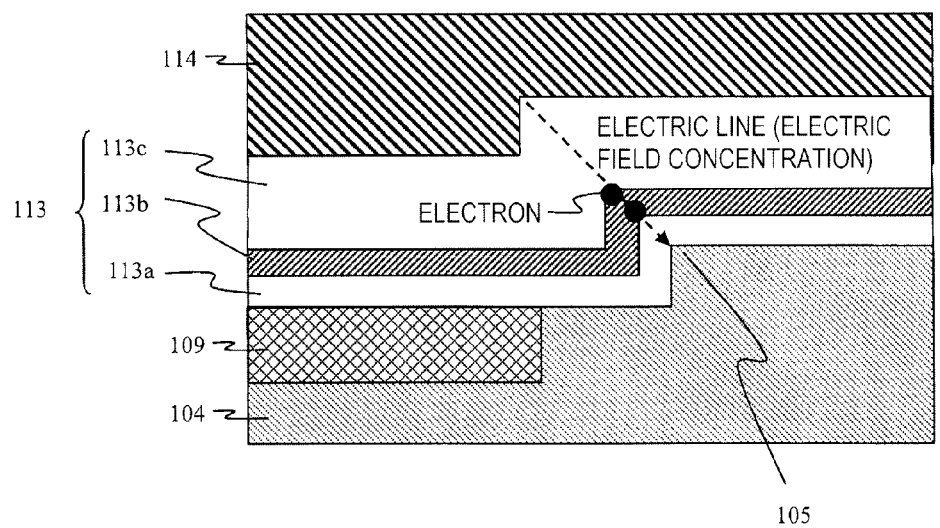
FIG. 16 illustrates a view illustrating electric field concentration of Embodiment 1.
Figure 32:
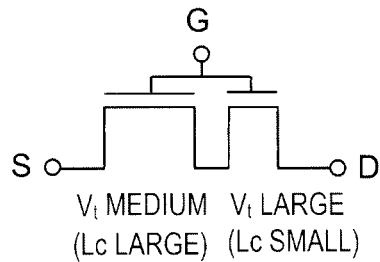
FIG. 32 illustrates a view illustrating an equivalent circuit illustrating the effect of the present invention.
Figure 32:
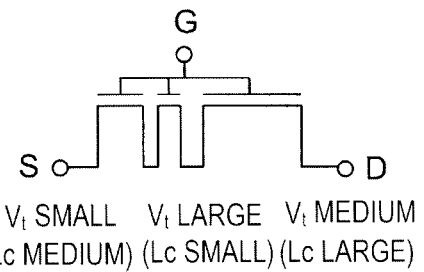
Figure 32:
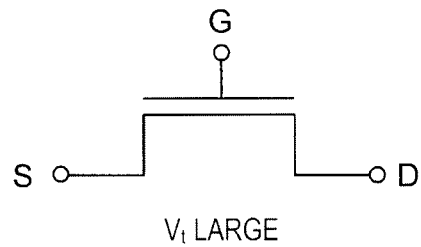

A model of the electron injection in the present invention is described with reference to FIG. 16. FIG. 16 is a view which enlarges an area of the subtle step 105 formed on the inside of the p-type body 104. In a case where the electron injection is performed in the layered gate insulation film 113, the source diffusion layer 109, the drain 118, and the p-type body 104 are fixed at 0 V, and the positive voltage is applied to the gate electrode 114. In this case, a channel is formed on the p-type body front surface, and the electron is injected toward the gate electrode from the SiC substrate side. At this time, since electric lines from the gate electrode 114 are concentrated toward the subtle step 105 on the SiC substrate, the electron injection amount (current) in this part becomes larger compared to the electron injection amount in other parts. In other words, the electron trap amount of the gate insulation film 113 in the vicinity of the local step 105 becomes larger compared to the electron trap amount in other areas, and thus, the threshold voltage in the subtle area increases. This case is the same as the case of the equivalent circuit illustrated in FIG. 32, and characteristics of a short channel MOS MET which has a large mutual conductance (including the channel mobility) are discovered.

In the present embodiment, the subtle step is formed on the SiC substrate front surface when forming the p body 104 or the high-concentration n-type diffusion layer 109. However, if the area is an area where the channel of the SiC MOSFET is formed, the subtle step may be formed in any stage. It is preferable that an area which is close to the drain end portion be provided in a direction as close to the source side as possible since the threshold voltage changes by an influence of the depletion layer which extends from the drain. The inventors performed the investigation regarding the variation amount of the threshold voltage, considering the subtle step which generates the electric field concentration, the distance from the drain end portion, and the drain voltage as parameters. As a result, within a range of 100 nm from the drain end portion, the threshold voltage significantly changes, but the variation amount decreases from approximately 100 nm. In the case of a position which is separated by approximately 200 nm, there is almost no change in the threshold voltage. Therefore, it is preferable that the subtle step which is formed in the channel forming area be set to be at a position which is separated from the drain end portion by a distance equal to or greater than 100 nm. In addition, it is preferable that the subtle step be set to be at a position which is separated from the drain end portion by a distance equal to or greater than 200 nm.

Meanwhile, the investigation was performed regarding a depth direction of the subtle step 105 which generates the electric field concentration. In a case where the electron is injected to the gate insulation film 113 from the SiC substrate side, a size of the electric field concentration applied to the gate insulation film 113 is determined by a radius of curvature of the step 105 and thickness of the gate insulation film 113. In the present invention, the radius of curvature of the step 105 may be considered as a size (depth) of the step 105. Within the range of the investigation of the inventors, if the depth of the step 105 is equal to or greater than 10% of the physical film thickness of the gate insulation film 113, a sufficient electric field concentration effect is obtained. However, when the step is too large, the reliability of the gate insulation film deteriorates, or the electric charge retention characteristics deteriorate. Within the range of the investigation of the inventors, in order to sufficiently obtain the effect of the present invention with the electric field concentration, and prevent the deterioration of the reliability of the gate insulation film, it is effective when the depth of the step is in a range of 5% or greater to 40% or less of the physical thickness of the gate insulation film.

Embodiment 2

Next, Embodiment 2 will be described. In Embodiment 1, the local electron injection of the gate insulation film is realized through the structural electric field concentration, but the local injection of the electron is performed by the hot carrier injection in the present invention. As described in Embodiment 1, when the electron is injected into the vicinity of an area which is the drain when the switching operation is performed, a change of the threshold voltage is generated by the switching operation. Therefore, it is necessary to inject the electron into the source end portion. Since the p body and the source diffusion layer are fixed to the same potential in the general SiC DiMOS, the hot carrier injection into the source end portion cannot be performed. For this reason, in the present embodiment, a structure in which the source potential and the potential of the p body can be separated from each other is employed, and the electron injection into the source end portion is performed.

Figure 23:
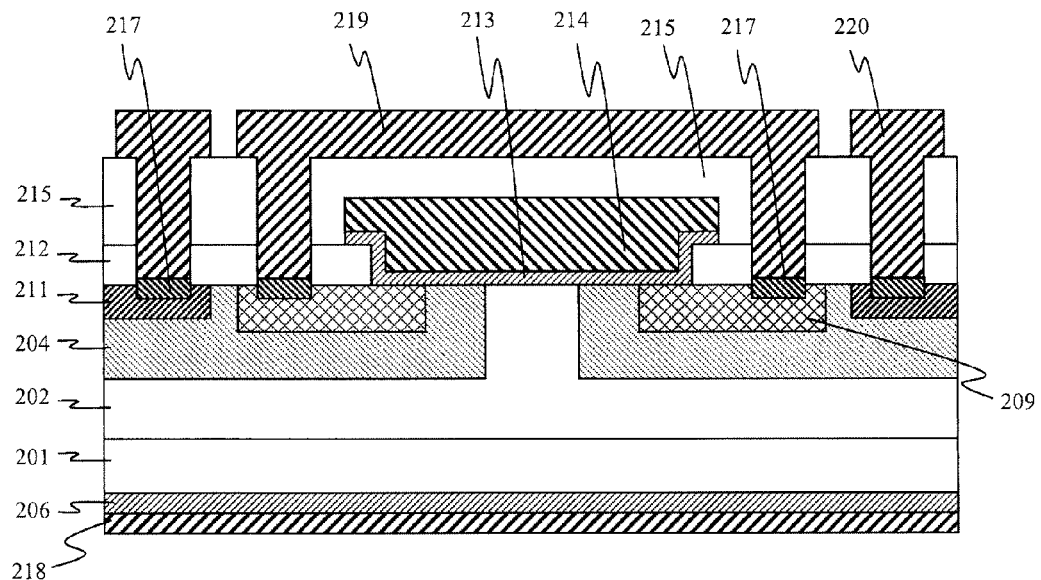
FIG. 23 illustrates a part of a cross-sectional structure of a SiC DiMOSFET of Embodiment 2.

FIG. 23 illustrates a cross-sectional structural view of the SiC DiMOS which is manufactured in Embodiment 2. Similarly to the sample No. 1 of Embodiment 1 illustrated in FIG. 1, the subtle step is not formed in the p body area. The SiC DiMOS of Embodiment 2 is different from the SiC DiMOS of Embodiment 1 in that a high-concentration n-type diffusion layer 209 and a high-concentration p-type diffusion layer 211 are separated from each other, and each of the high-concentration n-type diffusion layer 209 and the high-concentration p-type diffusion layer 211 are connected to source wiring 219 and p body wiring 220 separately. Other forming methods or structures are almost the same as those in Embodiment 1.

After completing the SiC DiMOS illustrated in FIG. 23, the electron is injected into a gate insulation film 213 of an end portion of a source 209 by the hot carrier by controlling the voltage from the outside. In addition, at the time of current injection when the normal switching operation is performed, the rear surface side is the drain since the SiC DiMOS applies the positive voltage to the rear surface side. However, it should be considered that the drain when the hot carrier injection is performed in the present embodiment is the source when the switching operation is performed. Here, in order to avoid confusion, the description will use a name when the switching operation is performed.

The injection conditions of the hot carrier are conditions such that the potential of a p body 204 is 0 V, the potential of a drain 218 is 0 V, and the source potential is equal to the gate potential. For example, when both the gate voltage and the source voltage are 20 V, the electron is injected into the local area of the gate insulation film 213 of the end portion of the high-concentration n-type diffusion layer 209 which is the source.

When comparing effects before and after the electron injection by the hot carrier, effects which are almost the same as the effects illustrated in Embodiment 1 are obtained.

After the hot carrier injection, when dicing of a chip is performed and wire bonding is performed, by linking the above-described p body wiring 220 and the source wiring 219 to each other by the same wire bonding, it is possible to perform the same operation as the SiC DiMOS manufactured in Embodiment 1.

Embodiment 3

In Embodiment 1, an embodiment of a horizontal type SiC DiMOS is illustrated. However, in the present embodiment, an application example of a trench gate electrode type SiC-MOSFET (hereinafter, referred to as a SiC-UMOS) will be described.

Figure 24:
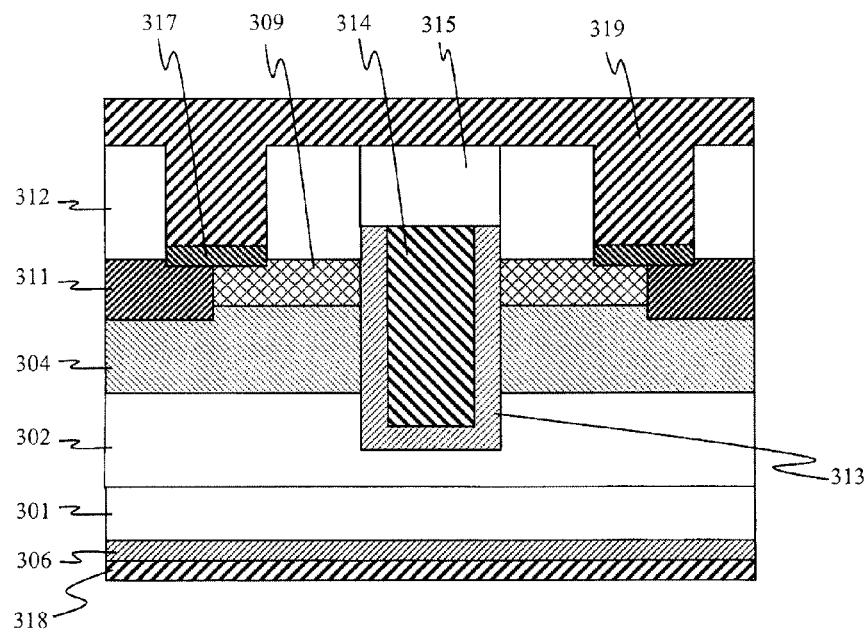
FIG. 24 illustrates a part of a cross-sectional structure of a SiC trench gate MOSFET of Embodiment 3.

FIG. 24 illustrates a cross-sectional structural view of the SiC UMOSFET. Reference number 301 represents a high-concentration n-type SiC substrate, reference number 302 represents a low-concentration n-type drift layer, reference number 304 represents a p-type body layer, reference number 306 represents a high-concentration n-type layer on a SiC rear surface side, reference number 309 represents a high-concentration n-type diffusion layer, reference number 311 represents a high-concentration p-type diffusion layer, reference numbers 312 and 315 represent insulation films, reference number 313 represents a gate insulation film having electric charge retention characteristics, reference number 314 represents a gate electrode, reference number 317 represents a silicide layer, reference number 318 represents a rear surface silicide layer (drain electrode), and reference number 319 represents an aluminum wiring (source electrode). In the SiC UMOS, the channel area is formed in the longitudinal direction (side wall of a trench groove) of the p-type body 304, and on-state resistance is low. In the present embodiment, in an area of the p body 304 where the channel is formed as illustrated in Embodiment 1, the subtle step is formed, the electron is injected into the gate insulation film 313 which uses the electric field concentration, and thus, the high threshold voltage and the high mobility coexist.

Figure 25:
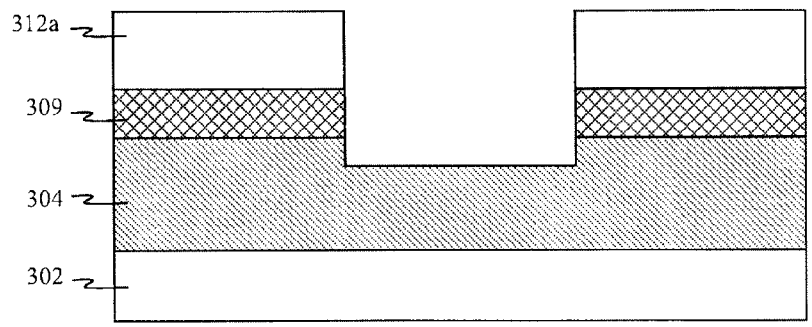
FIG. 25 illustrates a part of a cross-sectional structure of the SiC trench gate MOSFET of Embodiment 3.
Figure 26:
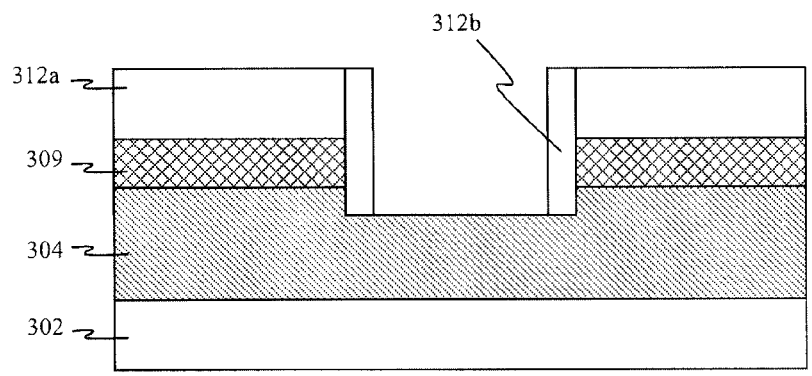
FIG. 26 illustrates a part of a cross-sectional structure of the SiC trench gate MOSFET of Embodiment 3.
Figure 27:
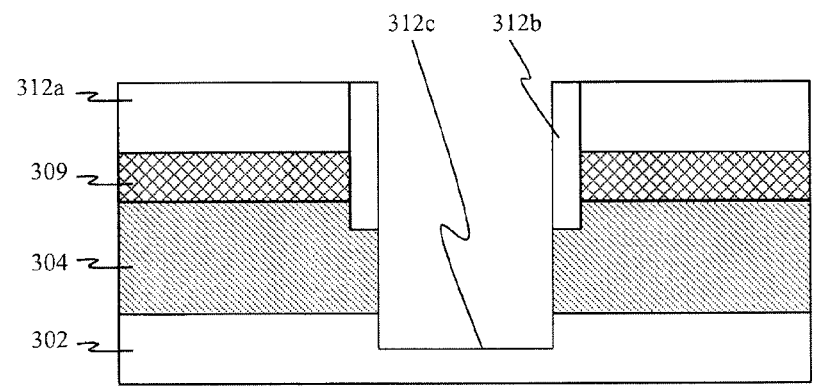
FIG. 27 illustrates a part of a cross-sectional structure of the SiC trench gate MOSFET of Embodiment 3.
Figure 28:
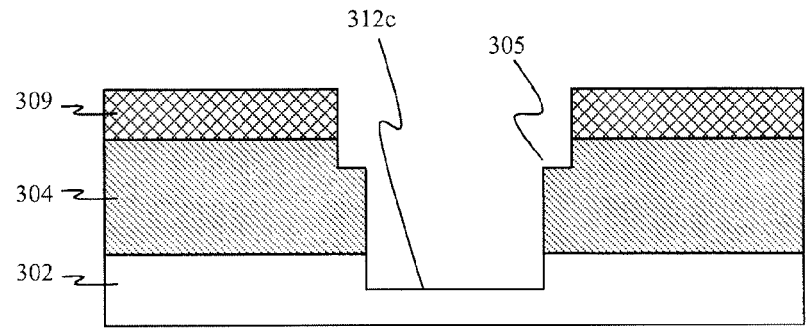
FIG. 28 illustrates a part of a cross-sectional structure of the SiC trench gate MOSFET of Embodiment 3.

Hereinafter, important parts of the present invention will be selected and described. First, on the low-concentration n-type drift layer substrate 302, the p-type body 304 and the high-concentration n-type diffusion layer 309 are formed by the ion-injection. Next, a $SiO_2$ pattern 312a is formed to be in a predetermined shape, and the high-concentration n-type diffusion layer 309 is dry-etched by using the $SiO_2$ pattern 312a as a mask (FIG. 25). Next, after forming the $SiO_2$ film having 20 nm of thickness on the entire surface through the LP-CVD method, by performing the anisotropic dry-etching method, a $SiO_2$ side spacer 312b is formed on a side wall portion of the above-described $SiO_2$ pattern 312a and on a side wall portion of the high-concentration n-type diffusion layer 309 (FIG. 26). Then, by using the above-described $SiO_2$ pattern 312a and the $SiO_2$ side spacer 312b as masks, a part of the p-type body 304 and the low-concentration n-type drift layer substrate 302 are dry-etched, and a trench groove 312c including the gate electrode 314 is formed (FIG. 27). Next, when the $SiO_2$ pattern which is used as a mask, is completely removed, as illustrated in FIG. 28, at the side wall portion of the p-type body 304, a subtle step 305 having approximately 20 nm of depth is formed. The depth of the step 305 can be controlled through the film thickness of the above-described $SiO_2$ side spacer 312b. In addition, the position of the longitudinal direction inside the trench groove 312c can control the high-concentration n-type diffusion layer 309 through the depth to be etched.

Figure 29:
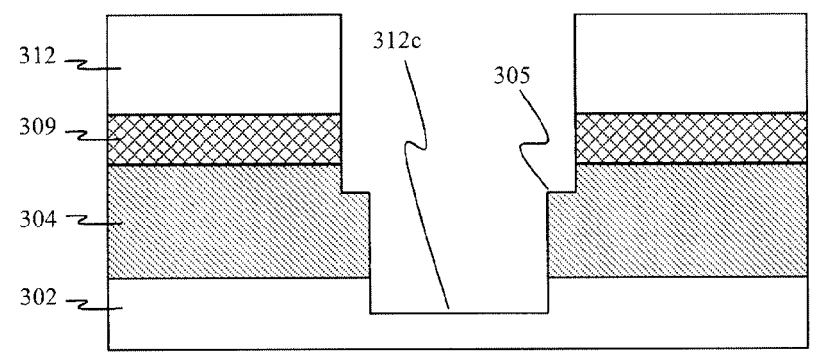
FIG. 29 illustrates a part of a cross-sectional structure of the SiC trench gate MOSFET of Embodiment 3.
Figure 30:
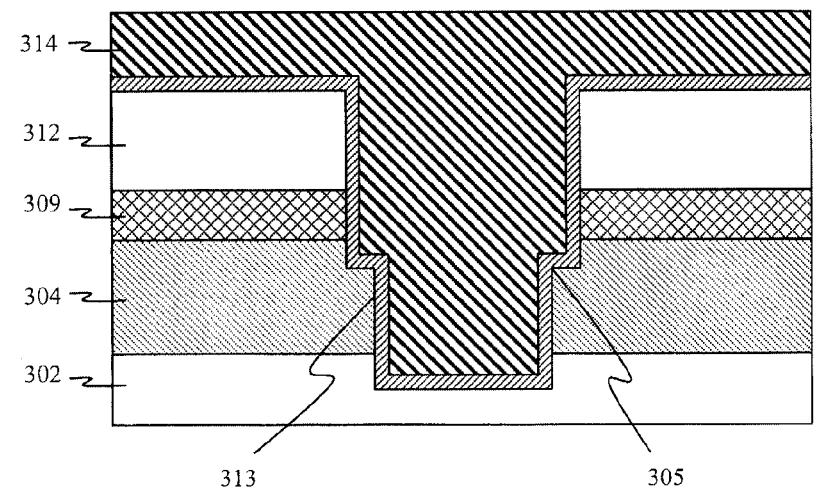
FIG. 30 illustrates a part of a cross-sectional structure of the SiC trench gate MOSFET of Embodiment 3.
Figure 31:
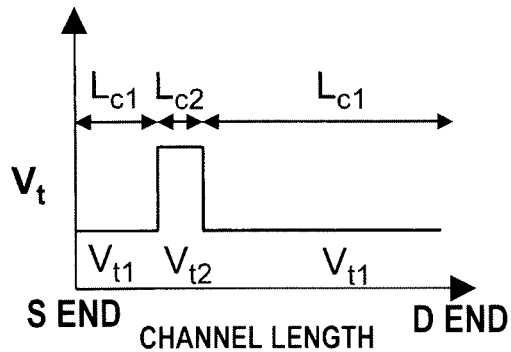
FIG. 31 illustrates a view illustrating a relationship between a channel direction and a Vt which illustrates an effect of the present invention.
Figure 31:
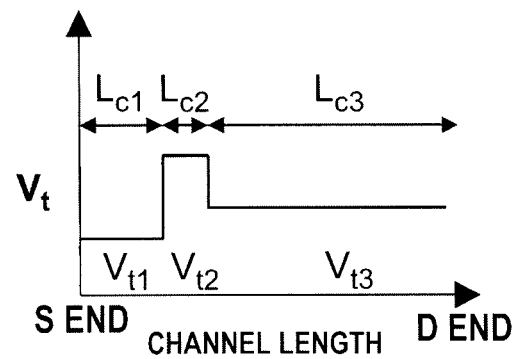

Next, after forming the $SiO_2$ film 312 which is an insulation film, an upper portion of the high-concentration n-type diffusion layer 309 is insulated with patterning (FIG. 29). Next, after forming the layered gate insulation film 313 having the electric charge retention characteristics, the gate electrode 314 is formed.

After this, the SiC UMOS illustrated in FIG. 24 is formed by a predetermined process. Even in the present embodiment, comparison between the method in the related art in which the subtle step 305 is absent inside the p-type body 304 and the method in the present invention is performed. The electron injection conditions and evaluation conditions are the same as those in Embodiment 1. Even in the present embodiment, a suppression effect of a decrease of drain current according to the electron injection, and an increase of the mutual conductance, are observed. In other words, a SiC MOSFET having a high threshold voltage and large channel motility is obtained.

In the present embodiment, as the gate insulation film having the electric charge retention characteristics, an example of the Si oxide film/alumina film/Si oxynitride film is illustrated. However, any layered film which has the electric charge retention characteristics and is provided with the potential barrier film (barrier film) above and below the gate insulation film can achieve the same effects. For example, even in the case of a layered film, such as a Si oxide film/Si nitride film/Si oxide film, a Si oxide film/Si nitride film/Si oxynitride film, a Si oxide film/alumina film/Si oxide film, or the like, it is possible to increase the threshold voltage by trapping the electron.

REFERENCE SIGNS LIST

- 101, 201, 301: High-concentration n-type SiC substrate
- 102, 202, 302: Low-concentration n-type drift layer
- 104, 204, 304: P-type body layer
- 106, 206, 306: Rear surface high-concentration n-type layer
- 109, 209, 309: High-concentration n-type diffusion layer
- 111, 211, 311: High-concentration p-type diffusion layer
- 113, 213, 313: Gate insulation film having electric charge retention characteristics
- 114, 214, 314: Gate electrode
- 112, 115, 212, 215, 312, 315: Insulation film
- 117, 217, 317: Silicide layer
- 118, 218, 318: Drain electrode (Silicide layer)
- 119, 219, 319: Source electrode

The invention claimed is:

1. A MOS field effect transistor formed on a SiC substrate, comprising:
    a SiC semiconductor layer which is a step on a surface that is in contact with a gate insulation film,
    wherein the gate insulation film is a layered film which includes an electric charge accumulation film,
    wherein a channel is configured between a source electrode and a drain electrode, and
    wherein 2 or more threshold voltages exist in a channel length direction of the channel, and the channel length in an area where the threshold voltage is the largest is the shortest.

2. The MOS field effect transistor according to claim 1, further comprising:
    a trench on the SiC semiconductor layer,
    wherein the gate insulation film is provided on the trench.

3. The MOS field effect transistor according to claim 1,
    wherein the gate insulation film includes a lower layer potential barrier film, an electric charge accumulation film which is in contact with the lower layer potential barrier film, and an upper layer potential barrier film which is in contact with the electric charge accumulation film.

4. The MOS field effect transistor according to claim 1,
    wherein an electron is trapped in the electric charge accumulation film.

5. The MOS field effect transistor according to claim 4,
    wherein the electron is locally trapped in the electric charge accumulation film.

6. The MOS field effect transistor according to claim 1,
    wherein a depth in a thickness direction of the gate insulation film of the step is in a range of 5% or greater to 40% or less of a physical film thickness of the gate insulation film.

7. The MOS field effect transistor according to claim 1,
    wherein an area where the threshold voltage is the largest is separated from a drain end portion by a distance of 100 nm or greater.

8. The MOS field effect transistor according to claim 7,
    wherein the area where the threshold voltage is the largest is separated from a drain end portion by a distance of 200 nm or greater.

9. The MOS field effect transistor according to claim 1,
    wherein, the gate insulation film is a layered film which is configured by combining the lower layer potential barrier film which is a Si oxide film or a Si oxynitride film, the electric charge accumulation film which is an oxide aluminum film or a Si nitride film, and the upper layer potential barrier film which is a Si oxide film.

10. The MOS field effect transistor according to claim 2,
    wherein an electron is trapped when an FN electron injection is performed from the SiC substrate side.

11. The MOS field effect transistor according to claim 3,
    wherein an electron is trapped when a hot carrier electron injection is performed from the SiC substrate side.

* * * * *